United States Patent
Loeffler (10) Patent No.: US 10,056,863 B2
(45) Date of Patent: Aug. 21, 2018

(54) TECHNIQUE FOR DETERMINING A TIME ALIGNMENT ERROR

(71) Applicant: Telefonaktiebolaget LM Ericsson (publ), Stockholm (SE)

(72) Inventor: Christoph Loeffler, Nuremberg (DE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/540,446

(22) PCT Filed: Jan. 5, 2015

(86) PCT No.: PCT/EP2015/050044
§ 371 (c)(1),
(2) Date: Jun. 28, 2017

(87) PCT Pub. No.: WO2016/110315
PCT Pub. Date: Jul. 14, 2016

(65) Prior Publication Data
US 2017/0353161 A1 Dec. 7, 2017

(51) Int. Cl.
*H03C 1/62* (2006.01)
*H04B 17/00* (2015.01)
*H03F 1/02* (2006.01)
*H03F 3/213* (2006.01)
*G06F 17/18* (2006.01)
*H04B 1/04* (2006.01)

(52) U.S. Cl.
CPC ........... *H03F 1/0222* (2013.01); *G06F 17/18* (2013.01); *H03F 1/0233* (2013.01); *H03F 3/213* (2013.01); *H04B 1/04* (2013.01)

(58) Field of Classification Search
CPC ....... H04B 1/04; H03F 1/0222; H03F 1/0233; H03F 3/213; G06F 17/18
See application file for complete search history.

(56) References Cited

U.S. PATENT DOCUMENTS

| 9,510,310 B1* | 11/2016 | Ibison ................ H04W 56/005 |
| 2003/0156658 A1 | 8/2003 | Dartois |
| 2008/0074186 A1* | 3/2008 | Sihlbom ............... H03F 1/3247 330/149 |
| 2008/0300003 A1* | 12/2008 | Jeck ..................... H04B 7/0671 455/517 |
| 2009/0117865 A1 | 5/2009 | Vinayak et al. |
| 2011/0260790 A1* | 10/2011 | Haddad .................... H03F 1/30 330/107 |
| 2011/0274210 A1 | 11/2011 | Chekhovstov et al. |
| 2013/0231069 A1 | 9/2013 | Drogi |
| 2013/0235949 A1 | 9/2013 | Jeckeln |

FOREIGN PATENT DOCUMENTS

JP 2006333450 A 12/2006

* cited by examiner

*Primary Examiner* — Nguyen Vo
(74) *Attorney, Agent, or Firm* — Coats & Bennett, PLLC (57) ABSTRACT

A technique for determining a time alignment (TA) error in a circuitry is provided. One or few measurement cycles can be utilized for a closed-loop TA alignment, e.g., for envelope tracking in a transmitter. As to a method aspect of the technique, the amplitudes of a first signal and a second signal are determined. A first measure is computed that is indicative of a relative amplitude error, and a second measure is computed that is indicative of a variation of at least one of the amplitudes. The TA error is determined by correlating the first and second measures.

15 Claims, 7 Drawing Sheets

TECHNIQUE FOR DETERMINING A TIME ALIGNMENT ERROR

TECHNICAL FIELD

The present disclosure relates to time alignment within a circuitry. More specifically, and without limitation, a method and a device for determining a time alignment error in a transmitter, e.g., for closed loop envelope tracking are provided.

BACKGROUND

Envelope tracking (ET) is a key feature of a user equipment (UE) to reduce energy consumption for radio transmission. ET is expected to be of even more importance for future high-end UEs. To meet an increasing demand for data throughput, complex modulation schemes, e.g., Orthogonal Frequency Division Multiplexing (OFDM), are applied that cause a largely varying signal envelope in a UE transmitter. Power amplifiers (PAs) operating with a constant supply voltage may therefore spend much time operating below their peak efficiency. An ET system continuously adjusts the power supply voltage of the PA to the amplitude of the signal to be amplified, so that the amplifier can permanently operate at peak efficiency. The ET system thus contributes significantly to reducing the energy consumption of the PA in the UE transmitter by minimizing the energy wasted by the PA through heat dissipation.

Envelope tracking is a nonlinear control approach. However, the signal transmission chain has to provide sufficient linearity, e.g., for fulfilling requirements on the Adjacent Channel Leakage Ratio (ACLR) and Error Vector Magnitude (EVM). Therefore, an accurate calibration is required to align the nonlinearities in the ET system such that an overall linear gain is achieved. A critical part of the calibration is the time alignment (TA) of the transmitted signal and the respective envelope. In currently known ET systems, however, TA calibration is very time consuming. Additionally, significant UE resources for computation and memory are required to obtain and store calibration coefficients. Therefore, solutions have been searched to reduce time and resources required for TA calibration.

In other known ET systems, the TA calibration is performed during UE production. However, TA changes due to component aging or parameter drift, e.g. temperature variation, which cannot be considered at the time of production. Therefore, efforts have been made to avoid TA calibration at production by implementing a closed-loop control for TA during normal operation of the UE. A closed-loop control additionally allows compensating variations of the antenna voltage standing wave ratio (VSWR) during TA, which can otherwise cause ACLR and EVM degradations.

Conventional closed-loop approaches for TA are disclosed in documents US 2013/0235949 A1 and US 2011/0274210 A1. However, the methods presented in the prior art have shortcomings in their practical application. The document US 2013/0235949 A1 uses a numerically demanding algorithm for calculating the TA error, including two Fast Fourier Transforms and several complex number calculations. Furthermore, the method for deducing the TA depends on peak and minima detections, which is sensitive to noise. The further document US 2011/0274210 A1 requires many iterations in the control loop for finding the optimum TA, thus severely limiting efficiency with respect to time. Also, the U-shaped cost function for determining the optimum TA does not indicate whether the TA error is positive or negative. Moreover, the function cannot be sharply evaluated and adds susceptibility to noise.

SUMMARY

Accordingly, there is a need for a time and resource efficient technique that allows determining accurate TA information.

As to one aspect, a method of determining a time alignment error in a transmitter is provided. The method comprises a step of determining a first amplitude of a first signal upstream of a signal processing unit in the transmitter and a second amplitude of a second signal downstream of the signal processing unit; a step of computing a first measure for a difference between the first amplitude and the second amplitude and a second measure for a variation of at least one of the first amplitude and the second amplitude; and a step of correlating the first measure and the second measure for determining the time alignment error.

By correlating the first measure and the second measure, the time alignment error may be estimated. The first measure and the second measure may be computed for the same point in time for determining the time alignment error. In an exemplary embodiment, one first measure and one second measure may underlay the correlation, e.g., to the benefit of a fast determination of the time alignment error. At least some embodiments of the technique thus efficiently determine a time alignment error for signals in a transmitter, e.g., within one measurement cycle. Same or further embodiments can be utilized for closed-loop time alignment, e.g., during operation of a mobile telecommunications terminal.

The signal processing unit may include two or more signal branches. Each of the two or more signal branches may receive the first signal. Two or more signals may be processed separately in the two or more signal branches, respectively. The two or more signals may be based on the first signal. The two or more signals may be mixed in the signal processing unit. The second signal may result from the mixed two or more signals.

The first and/or second amplitudes may be computed based on the first and second signals, respectively, in the digital domain. Signal processing of the first signal in the signal processing unit may include at least one of digital-to-analog conversion, up-conversion and power amplification. The step of determining the second amplitude may include at least one of tapping-off the second signal, a down-conversion and an analog-to-digital conversion.

A voltage of a power supply for the power amplification may be controlled based on the first amplitude. The voltage may be controlled as a function of the first amplitude. The function may include a linear part and/or a nonlinear part. The function may account for a nonlinearity of the power amplification.

Based on the determined time alignment error, at least one of a first time delay in a first signal path (e.g., in a first signal branch of the two or more signal branches) and a second time delay in a second signal path (e.g., in a second signal branch of the two or more signal branches) may be controlled. The signal processing unit may be arranged in the first signal path. The power supply may be arranged in the second signal path.

At least one of the first time delay and the second time delay may be controlled according to a closed-loop control. The closed-loop control may minimize the determined time alignment error. The closed-loop control may be non-iterative. E.g., the time alignment error may be computed for one point in time or based on a period of time, and the time alignment error may be compensated by setting the first time delay and/or the second time delay at once.

The correlation may be based on a plurality of the first measures and the second measures. The correlation may be based on a plurality of pairs each including the first measure and the second measure.

The step of correlating may include computing a linear estimator for the correlation between the first measure and the second measure. The correlating step may include computing a least square regression. A slope of the least square regression may determine the time alignment error. Alternatively or in addition, the correlating may include averaging a ratio of the first measure and the second measure. Alternatively or in addition, the correlating step may include averaging the first measure with a sign determined by the second measure.

A corresponding plurality of first and second amplitudes may be determined. Each first measure and each second measure may be computed based on a pair of the determined first and second amplitudes. A subset out of a plurality of the determined first and second amplitudes may be selected for computing the first and second measures.

The method may be performed during normal operation of the transmitter. At least the step of determining the first and second amplitudes may be performed during a data transmission via the transmitter.

As to another aspect, a computer program product is provided. The computer program product comprises program code portions for performing any one of the steps of the method aspect disclosed herein when the computer program product is executed by one or more computing devices. The computer program product may be stored on a computer-readable recording medium. The computer program product may also be provided for download in a data network, e.g., the Internet. The data network may be accessed using the transmitter.

As to a hardware aspect, a device for determining a time alignment error in a transmitter is provided. The device comprises a determining unit adapted to determine a first amplitude of a first signal upstream of a signal processing unit in the transmitter and a second amplitude of a second signal downstream of the signal processing unit; a computing unit adapted to compute a first measure for a difference between the first amplitude and the second amplitude and a second measure for a variation of at least one of the first amplitude and the second amplitude; and a correlating unit adapted to correlate the first measure and the second measure for determining the time alignment error.

Any one of the units of the device, or a further dedicated unit, may be adapted to perform the any one of the steps disclosed in the context of the method aspect. Furthermore, the device may comprise any further feature disclosed in the context of the method aspect.

BRIEF DESCRIPTION OF THE DRAWINGS

In the following, the present disclosure is described in more detail with reference to exemplary embodiments illustrated in the drawings, wherein.

DETAILED DESCRIPTION

In the following description, for purposes of explanation and not limitation, specific details are set forth, such as specific device environments and specific transmission scenarios in order to provide a thorough understanding of the technique disclosed herein. It will be apparent to one skilled in the art that the technique may be practiced in other embodiments that depart from these specific details. Moreover, while the following embodiments are primarily described for a mobile transmitter operating according to Long Term Evolution (LTE), it will be readily apparent that the technique described herein may also be implemented in other mobile and stationary communication networks, including GSM networks, UMTS networks, LTE-Advanced networks and next-generation antenna arrays.

Moreover, those skilled in the art will appreciate that the functions, steps and units explained herein may be implemented using software functioning in conjunction with a programmed microprocessor, an Application Specific Integrated Circuit (ASIC), a Field Programmable Gate Array (FPGA), a Digital Signal Processor (DSP) or a general purpose computer, e.g., including an Advanced RISC Machine (ARM). It will also be appreciated that, while the following embodiments are primarily described in context with methods and devices, the invention may also be embodied in a computer program product as well as in a system comprising a computer processor and memory coupled to the processor, wherein the memory is encoded with one or more programs that may perform the functions, steps and implement the units disclosed herein.

Figure 1:
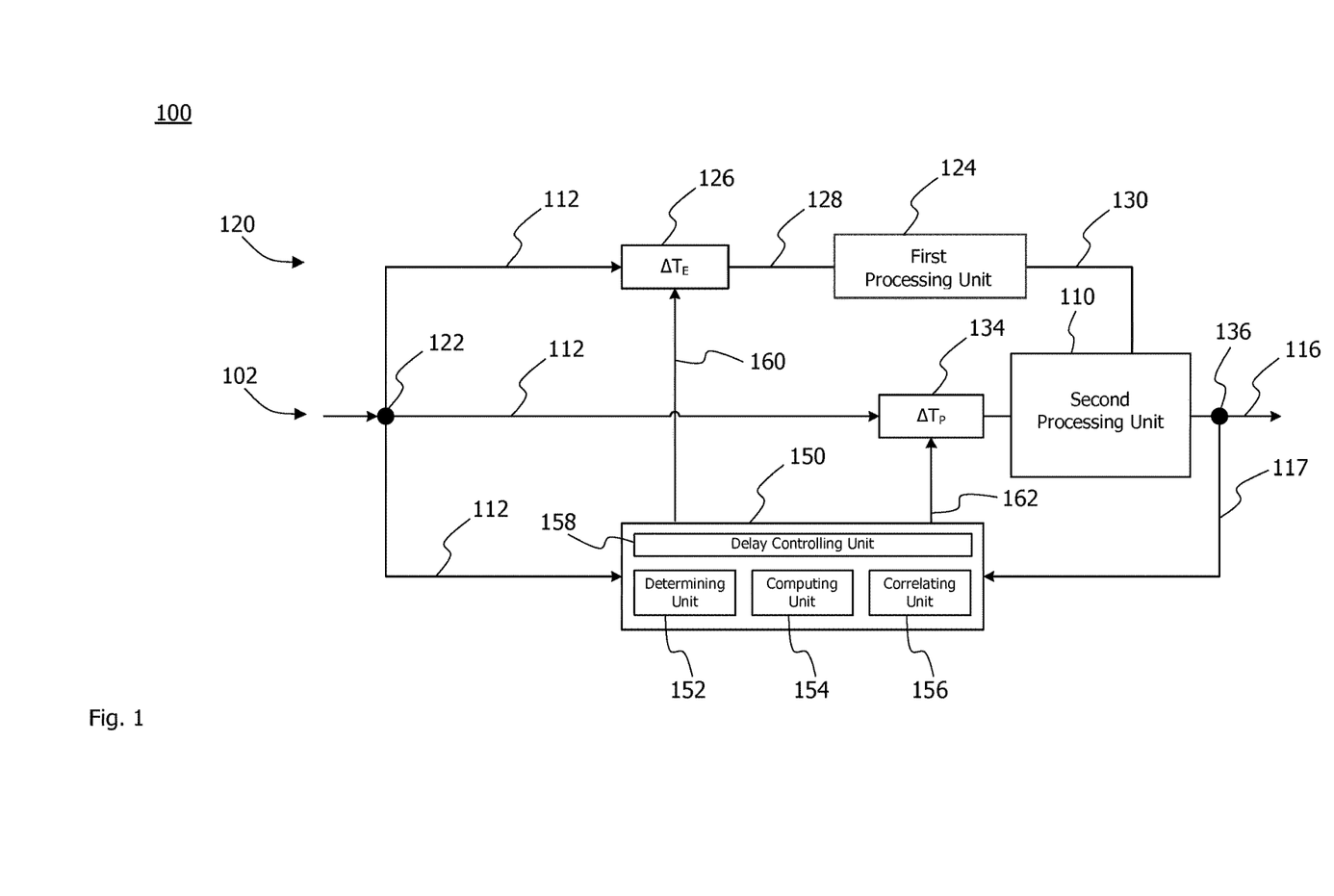
FIG. 1 schematically illustrates a circuitry comprising a device for determining a time alignment error and exemplary means for controlling time alignment.

FIG. 1 schematically illustrates an exemplary circuitry 100 for implementing the technique. The circuitry 100 includes a first signal branch 120 including a first processing unit 124 and a second processing branch 102 including a second processing unit 110. An incoming signal 112, e.g. a digital signal including In-phase (I) and Quadrature (Q) components, branches off at a point 122 in the first signal branch 120 towards the first processing unit 124 and the second signal branch 102 towards the second processing unit 110.

The input signal 112 is delayed in the first signal branch 120 by a time delay $\Delta T_E$ in a first delay unit 126 resulting in a delayed signal 128 that is input to the first signal processing unit 124. The input signal 112 is delayed by a time offset $\Delta T_P$ in a second delay unit 134 in the second signal branch 102 before being processed by the second processing unit 110.

An output signal 130 of the first processing unit 124 is input to the second processing unit 110 for further processing. An output signal 116 of the second processing unit 110 bifurcates downstream of the second processing unit 110 at a point 136.

The circuitry 100 comprises a device 150 for determining a time alignment error, e.g. as to a time alignment of the output signal 130 provided by the first signal branch 120 and the delayed signal in the second signal branch 102 at the second processing unit 110. A first signal based on the input signal 112 is input to the device 150. A second signal 117 is tapped off at the point 136 downstream of the second processing unit 110 for the device 150. Based on the first signal 112 and the second signal 117, the device 150 determines a time alignment error in the circuitry 100.

The device 150 comprises a determining unit 152 for determining a first amplitude and a second amplitude of the first signal 112 and the second signal 117, respectively. The device 150 further comprises a computing unit 154 for computing at least two measures based on the determined amplitudes. A first measure is indicative of the difference in amplitudes of the first and second signals 112 and 117. The difference in amplitudes is also referred to as an amplitude error. A second measure is indicative of the temporal variation of the first amplitude. In a variant of the computing unit 154, the second measure is, alternatively or additionally, indicative of the temporal variation of the second amplitude.

The device 150 further comprises a correlating unit 156. Based on the first and second measures, the correlating unit 156 determines the time alignment error, e.g., between the signals 112 and 117. Since the second signal 117 includes a component due to the output signal 130 of the first signal branch 120, the time alignment error may also be indicative of a misalignment between the two signals that are input to the second processing unit 110.

The device 150 optionally comprises a delay controlling unit 158 for controlling the delay units 126 and 134. The delay controlling unit 158 sets the time delays $\Delta T_P$ and $\Delta T_E$ such that the time alignment error is minimized or vanishes.

Figure 2:
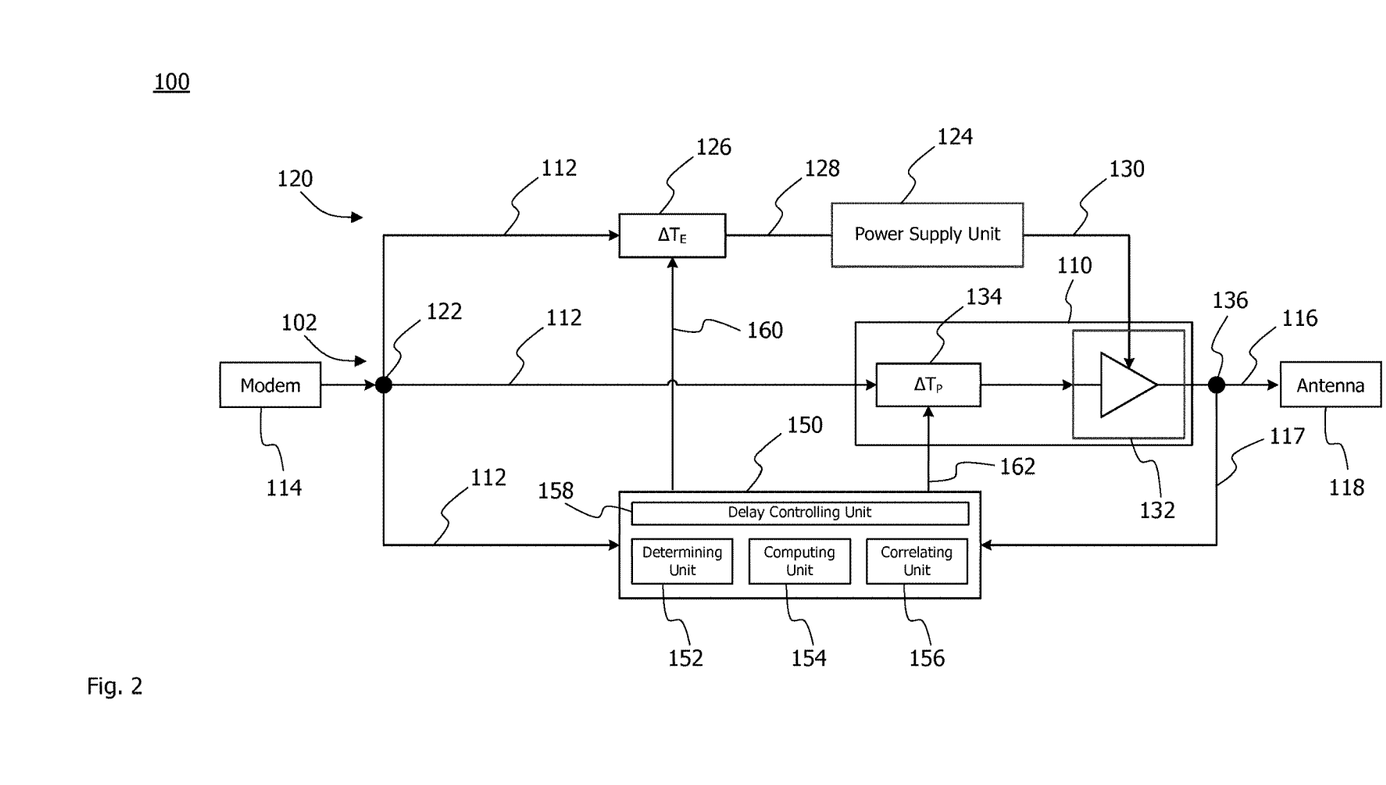
FIG. 2 schematically illustrates an embodiment of the circuitry of FIG. 1 for envelope tracking, implementable in a signal transmission stage of a user equipment.

FIG. 2 schematically illustrates a transmitter 100 as an exemplary circuitry environment for implementing the technique. Like features are indicated by corresponding reference signs. The first signal 112 is a digital IQ signal, e.g., a signal to be transmitted in a user equipment (UE). The first signal 112 is provided by a modem 114. The processing unit 110 includes a power amplifier (PA) 132. The output 116 of the PA 132 feeds an antenna 118.

The branched-off first signal branch 120 includes an envelope tracking chain. The first processing unit includes a power supply unit 124 that controls the voltage supplied to the PA 132.

The delay controlling unit 158 sets the time delay $\Delta T_E$ of the envelope signal 128 and the time delay $\Delta T_P$ of the first signal 112 to be transmitted so as to minimize or eliminate the time alignment error in the output signal 116 determined based on the first signal 112 and the second signal 117.

Figure 3:
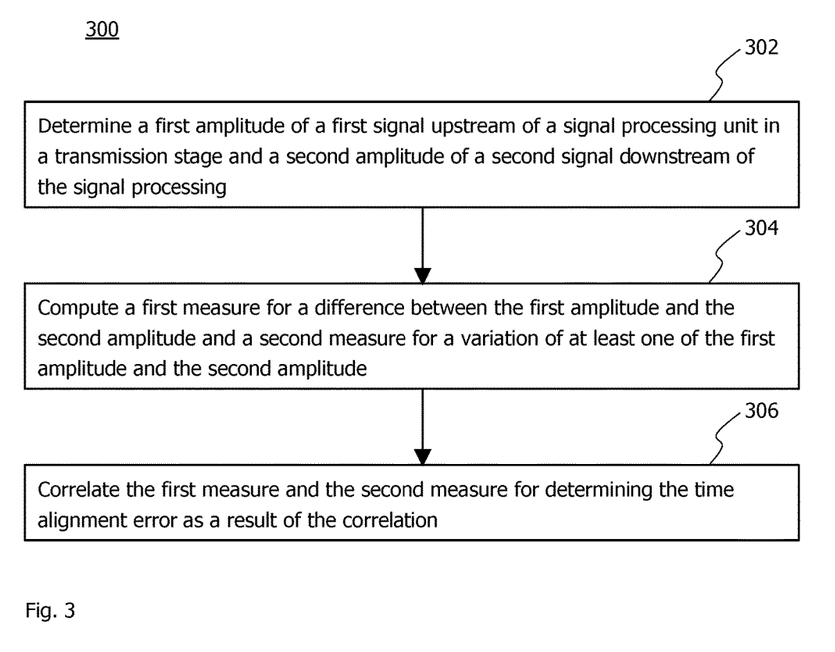
FIG. 3 shows a flowchart for a method of determining a time alignment error that is implementable in the device of FIG. 1 or 2.

FIG. 3 shows a flowchart for a method 300 of determining a time alignment error in a circuitry. In a step 302, an amplitude of a first signal upstream of a signal processing unit, e.g., upstream of the first signal processing unit 110 or upstream of each of the signal processing units 110 and 124, and an amplitude of a second signal, e.g., the signal 116 or 117, downstream of the signal processing unit are determined. In a step 304, a first measure is computed that is indicative for the difference between the first amplitude and the second amplitude, and a second measure is computed that is indicative for the variation of at least one of the first amplitude and the second amplitude. In a step 306, the time alignment error is determined using a correlation of the first and second measures. Optionally, one or more delays in the circuitry are controlled in response to the determined time alignment error.

The method 300 may be implemented in the device 150. E.g., the steps 302, 304 and 306 may be performed by the units 152, 154 and 156, respectively.

Figure 4:
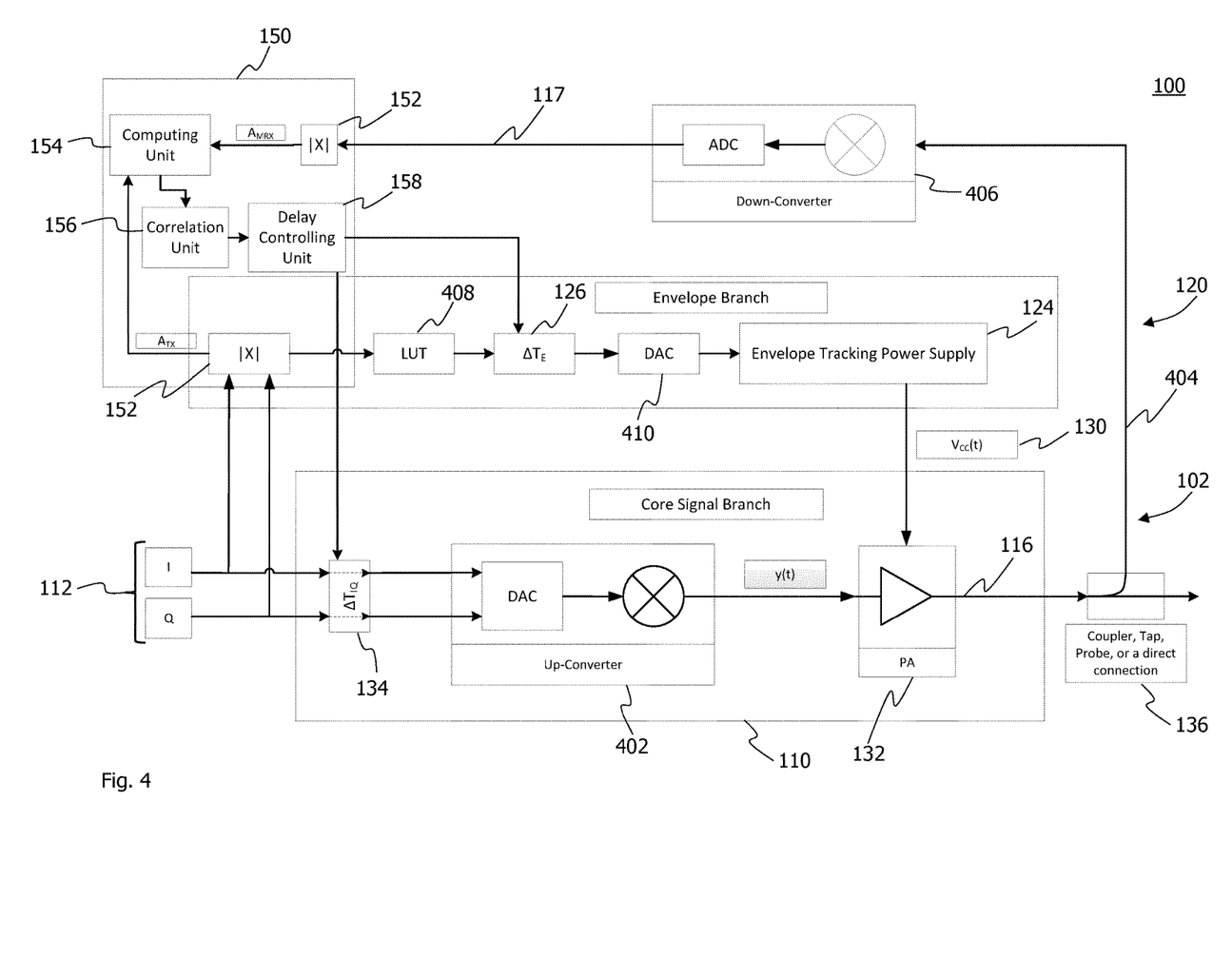
FIG. 4 schematically illustrates a block diagram of an envelope tracking system including an embodiment of the device of FIG. 1 or 2.

One embodiment of the technique implements envelope tracking (ET). FIG. 4 shows a block diagram of an ET circuitry 100. The ET circuitry 100 includes an embodiment of the device 150 for determining a time alignment error between the input signal, y(t), at the PA 132 and the envelope-modulated power supply voltage 130, $V_{CC}(t)$, supplied to the PA 132. The first signal 112 is a digital signal of the form $$x(t)=I(t)+jQ(t),$$

with j the imaginary unit. The time offset $\Delta T_P$ determined by the second delay unit 134 is denoted as $\Delta T_{IQ}$. The signal x(t) is up-converted after digital-to-analog conversion (DAC) in a unit 402. The resulting signal, y(t), is amplified by the PA 132.

The output signal 116 of the PA 132 is branched off in a coupler or tap 136. A branched-off output signal 404 is down-converted before analog-to-digital conversion (ADC) in a unit 406. The resulting second signal 117 is input to the device 150. Another input to the device 150 includes the first signal 112 branching-off to the envelope branch 120. Hereby, the same determining unit 152 can be used for the device 150 and the envelope branch 120.

The first amplitude is referred to by $A_{TX}$. The envelope branch 120 further includes a lookup table (LUT) 408 that may represent a functional relationship between the first amplitude $A_{TX}$ and the PA power supply voltage, $V_{CC}(t)$, 130. The functional relationship may compensate a non-linear behavior of the PA 132. The Envelope Tracking power supply unit 124 regulates the PA power supply voltage, $V_{CC}(t)$, 130 accordingly.

The digital signal for controlling the power supply unit 124 is time-delayed in the first time delay unit 126 and digital-to-analog converted in a unit 410.

The determining unit 152 calculates the first amplitude $A_{TX}$ ((which evolution as a function of time defines the envelope) and the second amplitude $A_{MRX}$ of the signals 112 and 117 that are input to the device 150, whereby $$A(t)=\sqrt{I(t)^2+Q(t)^2}=|x(t)|.$$

The respective amplitudes $A_{TX}$ and $A_{MRX}$ are used by the computing unit 154 to compute two measures, e.g., an amplitude error EA that indicates the difference between the amplitudes $A_{TX}$ and $A_{MRX}$ at a given time t, and an amplitude slope AS of the amplitude $A_{TX}$ at that time t. The correlating unit 156 determines the time alignment (TA) error by correlating the two measures.

The delay controlling unit 158 controls the time delays $\Delta T_{IQ}$ and $\Delta T_E$ according to the determined TA error. E.g., if the envelope $A_{TX}$ is ahead of the amplitude $A_{MRX}$, the delay controlling unit can prolong $\Delta T_E$ accordingly. If the envelope $A_{TX}$ is delayed with respect to the amplitude $A_{MRX}$, the delay controlling unit 158 can prolong $\Delta T_{IQ}$ accordingly. The former case and the latter case may be detected based on a sign of the determined TA error.

Figure 5:
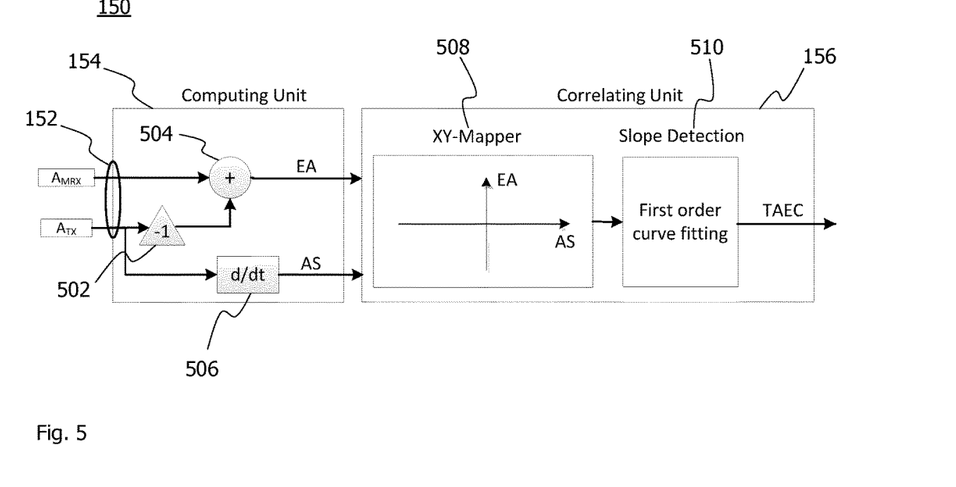
FIG. 5 illustrates a functional block diagram of the device embodiment of FIG. 4, wherein an amplitude error is correlated with an amplitude slope for determining a coefficient of the time alignment error.

In the following, exemplary implementations of the device 150 and the method 300 for determining the TA error are described. FIG. 5 shows the computing unit 154 and the correlating unit 156 in more detail. The digital first and second signals 112 and 117 are represented by a sequence of samples according to a time discretization $$t = i\Delta t, \, i=1, \ldots, n.$$

A sampling clock frequency defines a discretization time interval, $\Delta t$, according to $$\text{clock} = \frac{1}{\Delta t}.$$

For each sample i, the IQ signal has the form $$x(i) = I(i) + jQ(i),$$

wherein i is the ordinal number of the sample out of the sequence. The respective signal amplitude of each of the first and second signals 112 and 117 is given, based on the corresponding IQ signal sample, by $$A(i) = \sqrt{I(i)^2 + Q(i)^2} = |x(i)|.$$

For each sample i, the first and second amplitudes $A_{TX}(i)$ and $A_{MRX}(i)$ are input to the computing unit 154. The computing unit 154 computes by means of subunits 502 and 504 the amplitude error EA according to $$\Delta A(i) = A_{MRX}(i) - A_{TX}(i) =: EA(i)$$

as the first measure. As the second measure, the slope of the first amplitude $A_{TX}(i)$ is computed by applying a time derivation (first order numerical derivation) in a subunit 506 of the computing unit 154:

$$\frac{dA_{TX}(t)}{dt} \propto \frac{A_{TX}(i) - A_{TX}(i-1)}{\Delta t} = : AS(i).$$

In another embodiment of the device 150, the computation is based on the derivative of the second amplitude, $A_{MRX}$, instead of the derivative of the first amplitude $A_{TX}$.

In the correlating unit 156, a XY-mapper subunit 508 correlates the first and second measures by mapping the amplitude error EA(i) over the amplitude slope AS(i), as illustrated by means of an XY-diagram in FIG. 5, for all samples i.

For the case of $A_{TX}$ and $A_{MRX}$ being identical functions of time, except for a time shift according to the TA error $\Delta T$, it is observed that the quotient EA(i)/AS(i) approximates the TA error $\Delta T$. More specifically, when mapping EA(i) over AS(i) for a number of samples i, all points approximately lie on a straight line with a slope that corresponds to the TA error $\Delta T$. If the first amplitude $A_{TX}$ is advanced relative to the second amplitude $A_{MRX}$, the slope is negative. If the first amplitude $A_{TX}$ is delayed relative to the second amplitude $A_{MRX}$, the slope is positive. And if the first and second amplitudes are time-aligned, the slope will be zero.

In general, the correlating unit 156 utilizes information related to the slope of a line that approximates all points in the XY-diagram in order to determine TA error. The TA error-related slope in the XY-diagram is further on called TA error coefficient (TAEC).

In a first embodiment, if i is the ordinal number of a sample out of a sequence of n samples, a slope-detecting subunit 510 performs a regression, e.g., a least square regression according to $$TAEC_{LSQ} = \frac{n \sum_{i=1}^{n} AS(i) EA(i) - \sum_{i=1}^{n} AS(i) \sum_{i=1}^{n} EA(i)}{n \sum_{i=1}^{n} AS(i)^2 - \left(\sum_{i=1}^{n} AS(i)\right)^2}.$$

In a second embodiment, a linear regression is used in the subunit 510 to determine the TA error coefficient according to $$\overline{EA} = \frac{1}{n} \sum_{i=1}^{n} EA(i),$$

$$TAEC_{LIN} = \frac{1}{n} \sum_{i=1}^{n} \frac{EA(i) - \overline{EA}}{AS(i)}.$$

In a third embodiment, the sign of the slope of the amplitude AS(i) is used for the correlating 306. The dimensionless product of EA(i) and sign(AS(i)) is integrated or summed in the subunit 510 according to $$TAEC_{SIGN} = \frac{1}{n} \sum_{i=1}^{n} \text{sign}(AS(i)) EA(i).$$

While the first and second embodiments are statistically more robust than the third embodiment, the third embodiment is can be applied for certain amplitude types with less computation requirements.

In each embodiment, an accuracy of the determined time alignment error can be improved by selecting the measured samples, e.g., according to a thresholding scheme. By way of example, the correlating step 306 includes only samples i for which $$A_{low} < A_{TX}(i) < A_{high}$$

is fulfilled, e.g., for predefined thresholds $A_{low}$ and $A_{high}$.

In one embodiment, which is combinable with any one of above embodiments, the determining unit 152 or any other component of the circuitry 100 includes a gain compensation that calibrates the amplitudes $A_{TX}$ and $A_{MRX}$ to have the same average amplitude. For identical average amplitudes of the first and second signals 112 and 117, e.g., first and second signals that are exclusively delayed by a TA error, the TAEC can be derived from each sample i individually. The statistical methods for the slope detection 510, e.g. as described above, allow improving the accuracy of the TAEC estimate.

In another embodiment, which is combinable with any one of above embodiments, the amplitudes $A_{TX}$ and $A_{MRX}$ are renormalized prior to the correlating step 306, e.g., by determining a temporal mean amplitude $\overline{A}$ over a specified period $\Delta t_m \gg \Delta T$.

In the general case of $A_{TX}$ and $A_{MRX}$ differing in shape and/or amplitude, additionally to the TA error-related shift, a statistical evaluation of a sufficient amount of samples, e.g. by linear regression of all sample points in the XY-diagram, allows determining the TA error.

Figure 6:
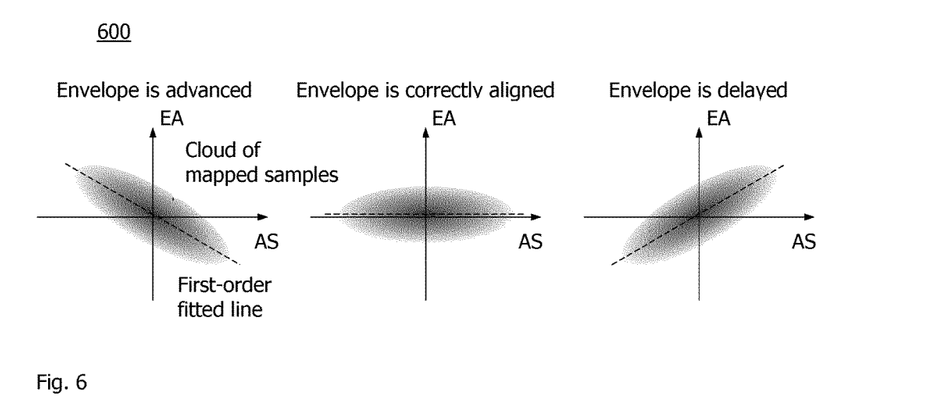
FIG. 6 schematically illustrates the correlation for a statistically sufficient amount of samples performable by the device embodiment of FIG. 4 or 5.

The mapping a sufficiently large amount of samples in the correlating step 306, e.g., in the subunit 508, is shown in FIG. 6. For each sample i, a point is plotted in the XY-diagram 600, resulting in a cloud of points. The TA error can be obtained by approximating the schematically oval-shaped cloud by a straight (first order fitted) line, since the slope of the approximated line is proportional to the TA error. A negative slope, as schematically illustrated in the left-hand side diagram 600 of FIG. 6, implies that the envelope $A_{TX}$ is advanced. A positive slope, as schematically illustrated in the right-hand side diagram 600 of FIG. 6, implies that the envelope $A_{TX}$ is delayed. A zero slope, as schematically illustrated in the center diagram 600 of FIG. 6, implies that the first and second signals 112 and 117 are correctly time-aligned. Thus, the technique allows determining a "direction" of the TA error.

The following considerations illustrate an implementation of the technique for a simplified model of the transmitter 100, e.g., according to FIG. 2 or 4. The input to the PA 132 is delayed by $\Delta T_{IQ}$ relative to the first signal, x(t), 112:

$$y(t) = x(t + \Delta T_{IQ}). \tag{1}$$

The voltage, $V_{cc}(t)$, 130 supplied to the PA 132 is a function of the first amplitude |x| of the first signal x delayed by $\Delta T_E$:

$$V_{cc}(t) = f(|x(t+\Delta T_E)|) = V_0 + a \cdot |x(t+\Delta T_E)| + O'(x^2(t+\Delta T_E)). \tag{2}$$

The PA 132 is modulated by the supply voltage $V_{cc}(t)$ and acts as a multiplicative mixer of the power amplifier input y(t) and the power amplifier supply voltage $V_{cc}(t)$:

$$\begin{aligned}
\text{Second signal} &= PA(y(t), V_{CC}(t)) \\
&= y(t) \cdot V_{CC}(t) + O'(y^2) \\
&= V_0 \cdot x(t+\Delta T_{IQ}) + a \cdot x(t+\Delta T_{IQ}) \cdot \\
&\quad |x(t+\Delta T_E)| + x(t+\Delta T_{IQ}) \cdot \\
&\quad O'(x^2(t+\Delta T_E)) + O'(x^2(t+\Delta T_{IQ})) \\
&= V_0 \cdot x(\tau + \Delta T) + a \cdot x(\tau + \Delta T) \cdot \\
&\quad |x(\tau)| + O'(x^2(\tau)) \\
&= V_0 \cdot x(\tau) + (V_0 + a \cdot |x(\tau)|) \cdot dx(\tau)/d\tau \cdot \\
&\quad \Delta T + O'(x^2(\tau)),
\end{aligned} \tag{3}$$

wherein τ is an abbreviation for the time variable $t + \Delta T_E$, the time alignment error is $\Delta T = \Delta T_{IQ} - \Delta T_E$, and the (renormalized) first signal is $V_0 \cdot x(T)$. Hence, $$\text{(Second Signal)} - \text{(First Signal)} = dx(\tau)/d\tau \cdot (V_0 + a \cdot |x(\tau)|) \cdot \Delta T + O'(x^2(\tau)),$$

or $$EA = AS \cdot (V_0 + a \cdot |x|) \cdot \Delta T + O'(x^2). \tag{4}$$

In other words, the slope derived in the correlating step 306 from the EA-AS-plot is proportional to the time alignment error ΔT.

Figure 7:
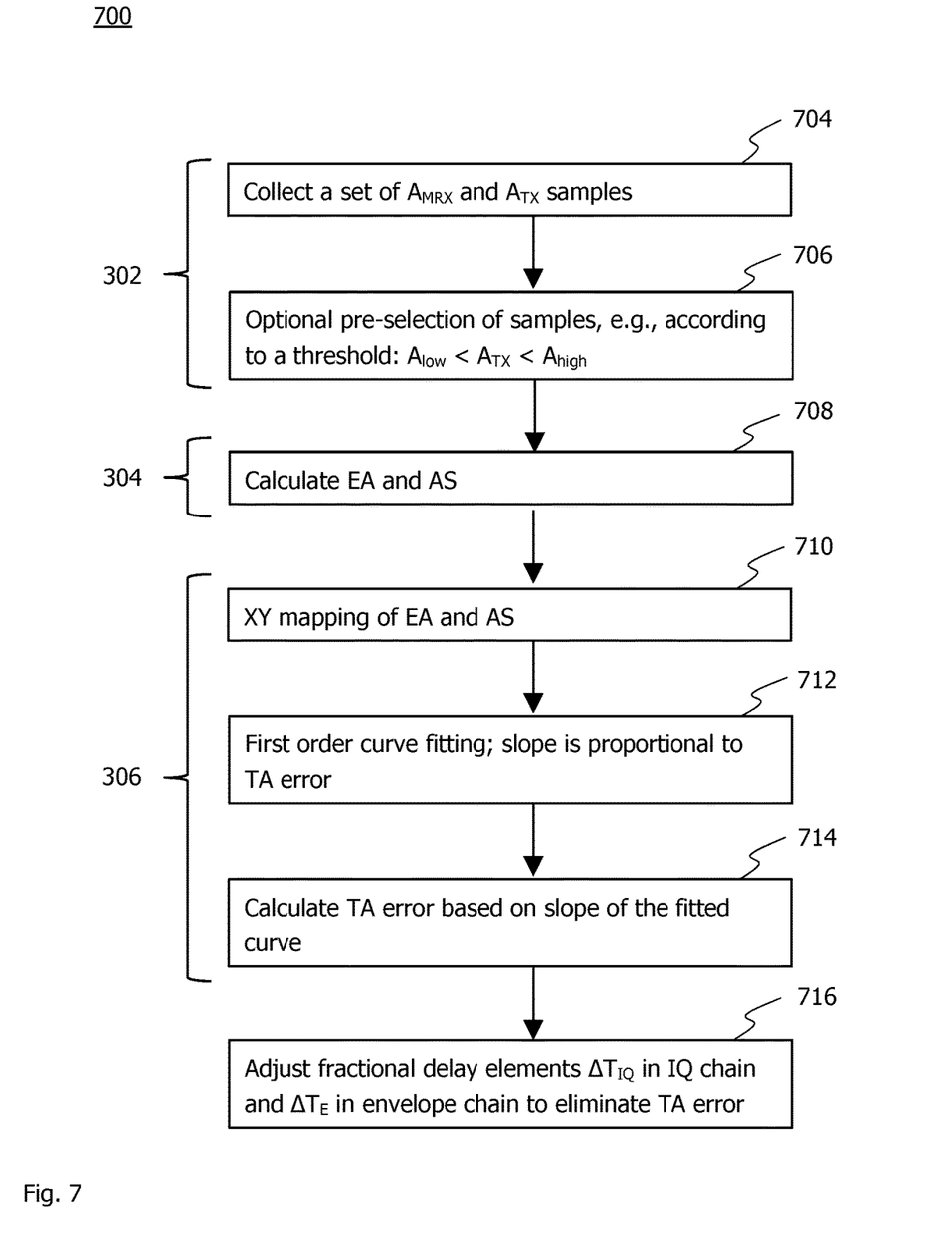
FIG. 7 shows a flowchart for an embodiment of the method of FIG. 3 that is compatible with a transmission operation of a user equipment.

FIG. 7 shows a flowchart 700 for an exemplary implementation the method 300. The steps of the flowchart 700 allow calculating the actual time alignment (TA) error under normal operation of a UE implementing the technique.

A set of $A_{MRX}$ and $A_{TX}$ samples are collected in a step 704, e.g., implementing the step 302. Optionally, the samples are preselected, e.g., according to the thresholding scheme, $A_{low} < A_{TX} < A_{high}$, in a step 706.

For each sample, the amplitude error EA and the amplitude slope AS are calculated in a step 708, e.g., implementing the step 304. The resulting first and second measures are mapped (e.g., in correspondence to the XY-diagram) in a step 710, e.g. as a substep of the step 306. A first order curve fitting is applied to the resulting point cloud, e.g. as a further substep of the step 306. The slope, which is proportional to the TA error, is determined in a step 712, e.g. as a still further substep of the step 306. The TA error is calculated based on the slope of the fitted curve in a step 714, e.g. as a still further substep of the step 306.

In an optional controlling step 716, the determined TA error is used to adjust the delay $\Delta T_{IQ}$ of the second delay unit 134 in the IQ chain 102 and/or the delay $\Delta T_E$ in the envelope chain 120, in order to eliminate the TA error.

Figure 8:
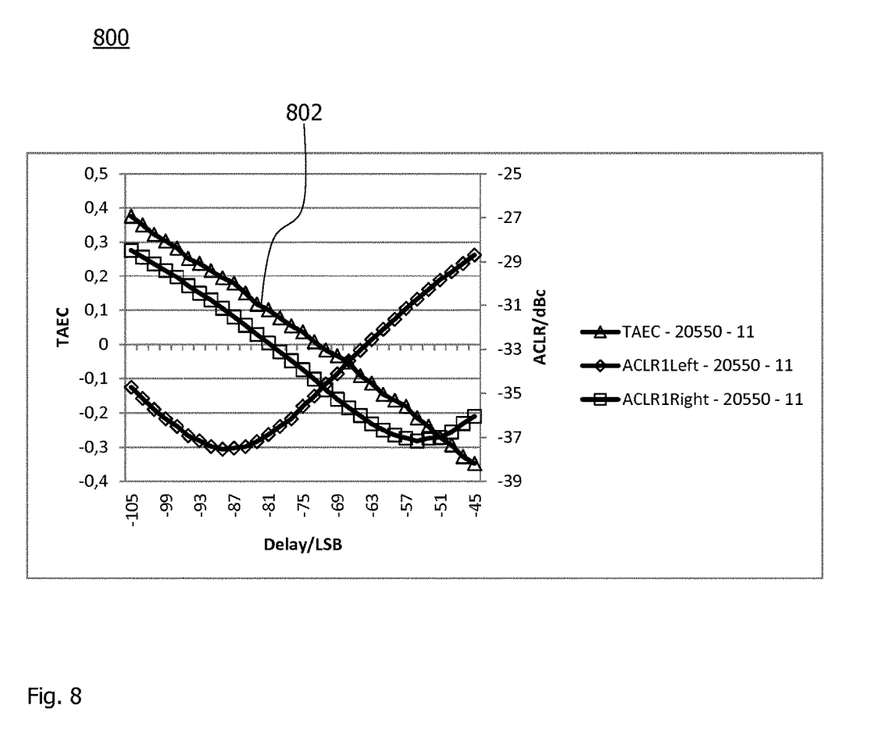
FIG. 8 shows a diagram including measurement results of the time alignment error coefficient in hardware.

FIG. 8 shows a diagram 800 including measurement results for the TA error determined by applying the technique on real hardware. The time delay in the envelope branch 120 relative to the amplification branch 102 is plotted on the horizontal axis of diagram 800. The time unit "LSB" for the relative delay $\Delta T_E - \Delta T_{IQ}$ refers to the least significant bits of control parameters 160 and 162 of the first delay unit 126 and the second delay unit 134, respectively. One delay time unit equals 0.4 ns.

During the measurement, the TA was swept by reprogramming the fractional TA alignment element, e.g., $\Delta T_{IQ}$. For each TA setting, the ACLR was captured. More specifically, "ACLRLeft" denotes the ACLR due to leakage into a 10 MHz frequency domain adjacent to and below a 10 MHz signal frequency range, and "ACLRRight" denotes leakage into a 10 MHz frequency domain adjacent to and above the 10 MHz signal frequency range.

First, it is observed that the TA error values 802 determined according to the technique form to a substantially straight line going from positive to negative values. The determined TA error values 802 are thus a linear function of the preset TA error, so that the actual TA error and the TA error determined by the technique are linearly related. In other words, the technique provides a linear estimate of the TA error.

Second, at the relative delay time value−73, the ACLR is optimally adjusted (i.e., the sum of ACLRLeft and ACLRRight reaches a minimum), which is exactly the relative delay time value for which the determined TA error values 802 cross zero TA error. The experimental data thus confirms that the TAEC estimation can replace an ACLR calculation for determining the TA error. Furthermore, the TA error is not only detected but quantitatively estimated, including the sign of the TA error.

Since ACLR calculations are numerically demanding, e.g., involving FFTs, the technique provides time alignment in a faster and numerically much more efficient manner than conventional techniques. Additionally, TAEC-based TA is independent from the actual shape and frequency range of the amplified signal, which makes the technique universally applicable, e.g., compared to ACLR-based TA approaches. E.g., delay variations in an envelope branch can be measured during normal operation due to the universality. Therefore, time alignment error compensation can be performed in a closed-loop control, which is not possible with conventional techniques.

As has become apparent from above description of exemplary embodiments, at least some embodiments require no additional hardware for implementing the technique. The TA error can be estimated solely by the technique, e.g., without or independently of conventional ACLR-based approaches. Furthermore, the technique can avoid or reduce transmitter signal distortion, e.g., ACLR and EVM, which are caused by a TA error. Furthermore, changes in a VSWR of a mobile transmit antenna can be compensated by closed-loop time alignment, which can eliminate a need for a dedicated antenna tuner.

Computing and/or correlating data that is already available can implement the technique. Such data can include an amplitude error measure and an amplitude slope measure.

In contrast to conventional techniques, e.g., as presented in document US 2011/0274210 A1, at least some embodiments do not require a special DSP for calculating filter functions, thus reducing hardware costs.

The technique can be based on data out of data streams available in current radio frequency integrated circuits (RFICs). A numerical implementation can be slim and complex number calculation can be completely avoided. Thus, calculation speed can be drastically increased compared to existing techniques, and the exact time alignment error can be determined within one or few measurement cycles. The technique can be implemented independently of any tailored test signals. The technique can be implemented based on a wide range of signals. This allows real-time determination of the time alignment error and/or time alignment during normal operation of a user equipment.

The time alignment can be kept optimal under varying environmental and operating conditions. Drifts in relative time delay due to component aging, temperature change, etc. can be eliminated by a closed-loop control. Time-consuming time alignment calibrations during user equipment production can be omitted.

A control loop can eliminate the timing error within one step. E.g. based on the magnitude and sign of the determined time alignment error, the technique can be implemented for determining and fully compensating the time alignment error without iterations.

Compared to other techniques, e.g., ACLR tuning, no numerically expensive calculations such as FFTs are necessary, nor is a tailored test-signal required. It is thus possible to perform the technique during normal user equipment operation, thereby eliminating the need of calibration and improving the stability of a transmitter against a changing antenna VSWR. Idle time windows of the transmission can be avoided.

Many advantages of the present invention will be fully understood from the foregoing description, and it will be apparent that various changes may be made in the form, construction and arrangement of the units and devices without departing from the scope of the invention and/or without sacrificing all of its advantages. Since the invention can be varied in many ways, it will be recognized that the invention should be limited only by the scope of the following claims.

The invention claimed is:

1. A method of determining a time alignment error in a transmitter, the method comprising:
   determining a first amplitude of a first signal upstream of a signal processing unit in the transmitter and a second amplitude of a second signal downstream of the signal processing unit;
   computing a first measure for a difference between the first amplitude and the second amplitude and a second measure for a variation of at least one of the first amplitude and the second amplitude; and
   correlating the first measure and the second measure for determining the time alignment error.

2. The method of claim 1, wherein determining the second amplitude includes at least one of tapping-off the second signal, down-conversion, and analog-to-digital conversion.

3. The method of claim 1, wherein signal processing of the first signal in the signal processing unit includes at least one of digital-to-analog conversion, up-conversion, and power amplification.

4. The method of claim 3, further comprising controlling a voltage of a power supply for the power amplification based on the first amplitude.

5. The method of claim 4, further comprising controlling, based on the determined time alignment error, at least one of a first time delay in a first path including the power supply and a second time delay in a second signal path including the signal processing unit.

6. The method of claim 5, wherein at least one of the first time delay and the second time delay are controlled according to a closed-loop control minimizing the determined time alignment error.

7. The method of claim 1, wherein the correlating is based on a plurality of the first measures and the second measures.

8. The method of claim 1, wherein the correlating includes computing a linear estimator for the correlation between the first measure and the second measure.

9. The method of claim 1, wherein the correlating includes computing a least square regression, wherein a slope of the least square regression determines the time alignment error.

10. The method of claim 1, wherein the correlating includes averaging a ratio of the first measure and the second measure.

11. The method of claim 1, wherein the correlating includes averaging the first measure with a sign determined by the second measure.

12. The method of claim 1, further comprising selecting a subset out of a plurality of determined first and second amplitudes for computing the first and second measures.

13. The method of claim 1, wherein at least the determining the first and second amplitudes is performed during a data transmission via the transmitter.

14. A non-transitory computer readable recording medium storing a computer program product for determining a time alignment error in a transmitter, the computer program product comprising software instructions which, when run on processing circuitry of a computing device, causes the computing device to:
   determine a first amplitude of a first signal upstream of a signal processing unit in the transmitter and a second amplitude of a second signal downstream of the signal processing unit;
   compute a first measure for a difference between the first amplitude and the second amplitude and a second measure for a variation of at least one of the first amplitude and the second amplitude; and
   correlate the first measure and the second measure for determining the time alignment error.

15. A device for determining a time alignment error in a transmitter, the device comprising:
   processing circuitry;
   memory containing instructions executable by the processing circuitry whereby the device is operative to:
     determine a first amplitude of a first signal upstream of a signal processing unit in the transmitter and a second amplitude of a second signal downstream of the signal processing unit;
     compute a first measure for a difference between the first amplitude and the second amplitude and a second measure for a variation of at least one of the first amplitude and the second amplitude; and
     correlate the first measure and the second measure for determining the time alignment error.

* * * * *